United States Patent [19]

Simpson et al.

[11] Patent Number: 5,096,426

[45] Date of Patent: Mar. 17, 1992

[54] CONNECTOR ARRANGEMENT SYSTEM AND INTERCONNECT ELEMENT

[75] Inventors: Scott S. Simpson, Woodstock, Conn.; Steven C. Lockard, Phoenix, Ariz.; William P. Harper, Tempe, both of Ariz.

[73] Assignee: Rogers Corporation, Rogers, Conn.

[21] Appl. No.: 639,982

[22] Filed: Jan. 11, 1991

Related U.S. Application Data

[63] Continuation-in-part of Ser. No. 452,810, Dec. 19, 1989, abandoned.

[51] Int. Cl.$^5$ .............................................. H01R 9/09
[52] U.S. Cl. ........................................ 439/66; 439/91; 29/883
[58] Field of Search ................. 439/66, 91, 591, 592, 439/620; 29/876, 883, 884

[56] References Cited

U.S. PATENT DOCUMENTS

| | | | |
|---|---|---|---|
| 2,967,216 | 1/1961 | Zablocki et al. | 29/597 |
| 3,778,752 | 12/1973 | Noyes | 439/620 |
| 3,992,761 | 11/1976 | McElroy | 29/25.42 |
| 4,209,481 | 6/1980 | Kashiro et al. | 264/24 |
| 4,295,700 | 10/1981 | Sado | 339/61 |
| 4,402,562 | 9/1983 | Sado | 339/61 |
| 4,445,735 | 5/1984 | Bonnefoy | 439/592 |
| 4,514,032 | 4/1985 | Lawrence | 439/884 |
| 4,610,495 | 9/1986 | Landi | 339/75 |
| 4,793,814 | 12/1988 | Zifcak et al. | 439/66 |

OTHER PUBLICATIONS

Circuit News, Dec. 1989, Rogers Offers Area Array Test Kits.
Connection Technology, Sep. 1988.
Designfax, Apr. 1988, Pivoting Connectors Eliminate Pins and Solder.
Design News, Jul. 4, 1988, Device Connects Without Pins.
Design News, Feb. 13, 1989, Foam Sheet Joins Chip Carrier.
ECN, Mar. 1989, Connectors for Card Edge and Flat Cable.
EDN News, Jul. 6, 1989, Array Connector.
EDN News, Dec. 15, 1988, Connector System Uses No Pins or Soldering.
EE Product News, Apr. 1988, Pinless VLSI Array Connector Uses Elastomeric Foam.
Electronic Design, Jan. 12, 1989, Solderless Interconnections Grow.
Electronic Design, May 11, 1989, New Methods Vie for Dense, Fast Connector Slots.
Electronics, Nov. 27, 1986, A Simpler Way to Mount High-Pin-Count Modules.

*Primary Examiner*—Neil Abrams
*Attorney, Agent, or Firm*—Fish & Richardson

[57] ABSTRACT

A circuit board electrical interconnection system, including improved, elongated, bodily-rotatable interconnect elements, is disclosed. Each element has tab portions projection angularly from the opposing ends of the element, which tab portions define a pair of pad engagement surfaces. The pad engagement surfaces engage corresponding contact pads on opposing surfaces of two circuit boards by means of elastic support member. The element is divided longitudinally, axially or laterally into a plurality of sectors. Some sectors are electrically conductive, while others have other electrically predetermined characteristics. The two types of sectors are arranged in an alternating patter. The non-conducting sectors may be comprised of insulative, resistive or capacitive materials.

21 Claims, 6 Drawing Sheets

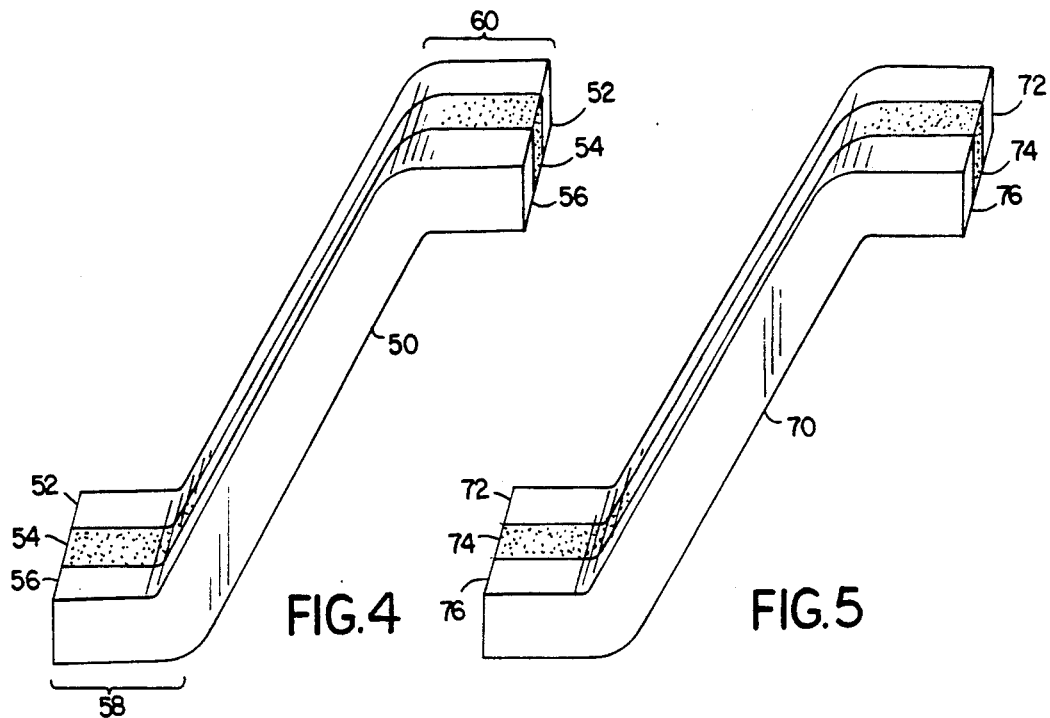
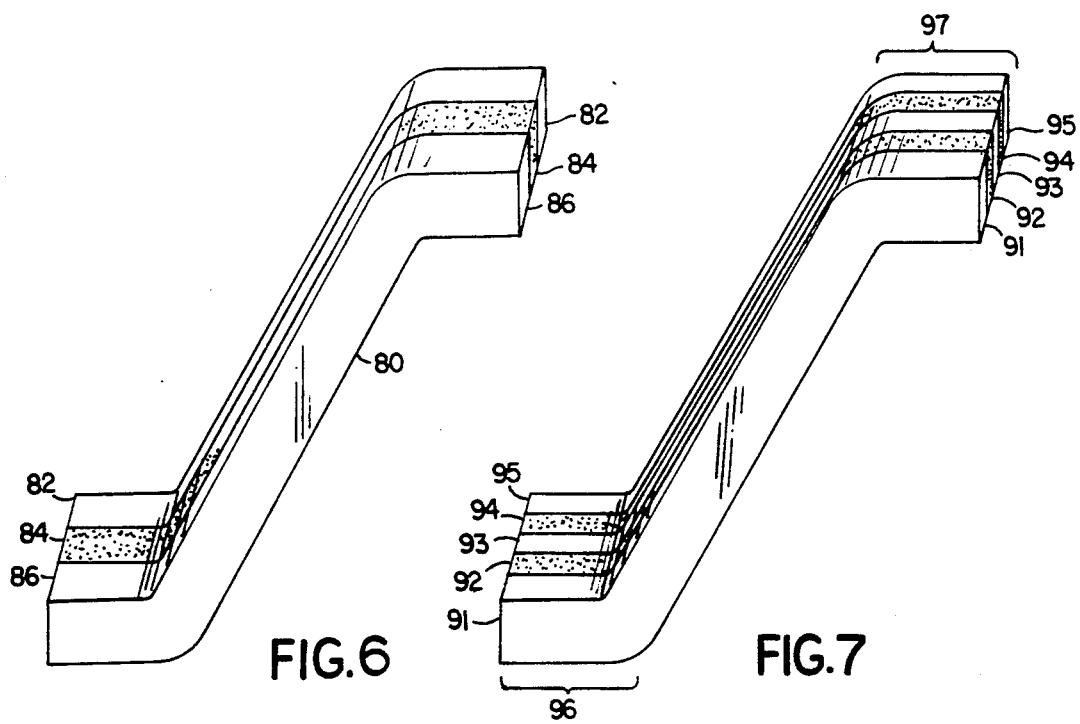

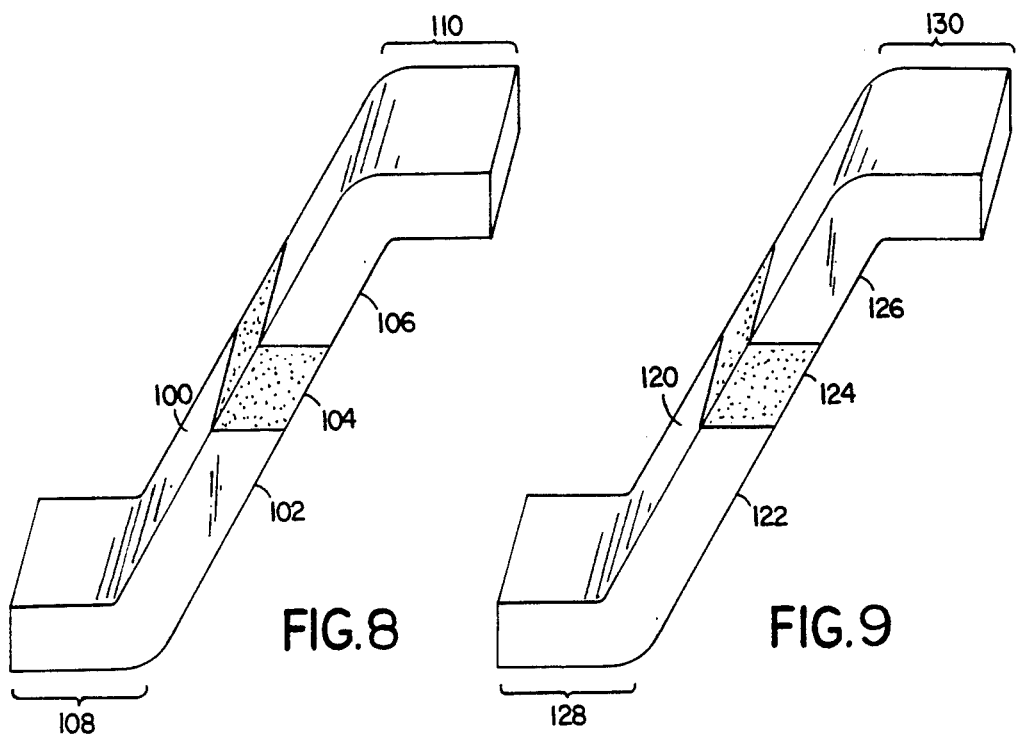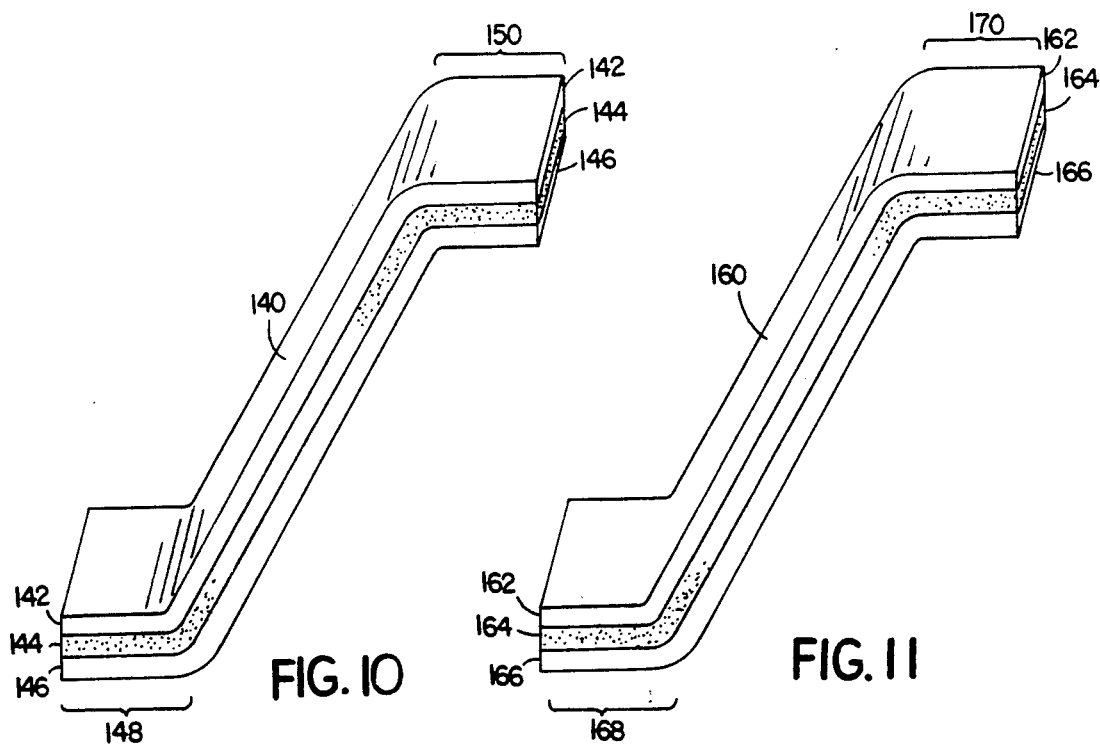

CONNECTOR ARRANGEMENT SYSTEM AND INTERCONNECT ELEMENT

This application is a continuation-in-part of U.S. patent application Ser. No. 07/452,810, filed Dec. 19, 1989, and entitled IMPROVED CONNECTOR ARRANGEMENT SYSTEM AND INTERCONNECT ELEMENT, now abandoned, the whole of which is hereby incorporated by reference herein.

BACKGROUND OF THE INVENTION

This invention relates to electrical circuit board interconnect systems, and particularly to bodily-rotatable interconnect elements used to connect contact pads on opposed circuit board surfaces.

It is known to use bodily-rotatable interconnect elements in a matrix-like support member to electrically connect contact pads on opposing surfaces of two circuit boards. Such elements and their support structures are disclosed in Zifcak et al. U.S. Pat. No. 4,793,814, which patent is incorporated herein by reference. Zifcak demonstrates interconnect elements composed entirely of electrically conductive material, each element connecting a single pad on one opposing circuit board surface to a corresponding single pad on the other board surface.

Objectives of the present invention include: providing such an interconnect element having predetermined electrical characteristics; providing such interconnect elements adapted to control impedance in the circuit, or adapted to lower the inductance of circuit board interconnections or terminations, or adapted to act as terminal resistors in the circuit, or adapted to act as decoupling capacitors; and providing connector systems containing a multiplicity of interconnect elements having one or more of these or other predetermined electrical characteristics.

SUMMARY OF THE INVENTION

According to the invention, a connector arrangement for providing electrical interconnection between a first contact pad on a surface of a first circuit board and a corresponding second contact pad on an opposed surface of a second circuit board comprises an electrically nonconductive support member, comprising resilient elastomeric material, disposed between the circuit boards, the support member having support surfaces respectively opposed to the surfaces of the first and second circuit boards and being adapted to be compressed by urging of the circuit boards together. The invention specifies an improved, bodily-rotatable, interconnect element extending through the thickness of the resilient support member and having a pair of pad engagement surfaces at tab portions, disposed to engage the respective contact pads of the circuit boards, a line projected through the engagement surfaces, at the time of their initial engagement upon the first and second contact pads, being disposed at an initial, acute angle to the direction of thickness of the support member. Also included are means for retaining the circuit boards in a clamped-together relationship with the support member in a compressed, reduced thickness state and with the interconnect element bodily rotated, whereby the line projected through the engagement surfaces lies at an acute angle to the direction of thickness of the support member greater than the initial angle, the body of the support member being locally deformed by the interconnect element and resiliently biasing the interconnect element towards its original position, into engagement with the pads.

In preferred embodiments, the circuit boards carry an array of matching contact pads in a predetermined pattern corresponding to the arrangement of circuits on the boards. The support member includes a corresponding array of the interconnect elements, the elements each being bodily rotatable in response to the clamped-together relationship of the circuit boards. The bodily rotation of an interconnect element locally deforms the compressed support member which resiliently biases it against the respective contact pads. Preferably, the support member is of sheet form, having inserted therein the array of interconnect elements corresponding to the pattern of the pads. The support member includes a distribution of voids that serve locally to accommodate the bodily rotation of the interconnect elements.

According to the instant invention, an elongated, bodily-rotatable interconnect element is also disclosed. The element has tab portions projecting angularly from both of the longitudinal ends of the element, which tap portions define the pair of pad engagement surfaces disposed to engage corresponding contact pads on opposing surfaces of the two circuit boards. The element is divided into a plurality of sectors. The sectors can be either electrically conductive or of materials having other, predetermined electrical characteristics. Examples of such other electrically predetermined characteristics are insulative, resistive, or capacitive materials. The sectors are arranged such that the electrically predetermined sectors are interposed between the conductive sectors, thus forming an alternating pattern of conductive and electrically predetermined sectors within the element. Typically, the two exterior sectors are conductive.

In one embodiment, the element is divided longitudinally into three sectors. Two of these sectors are conductive and the other one is a central electrically predetermined sector. In this embodiment, one of the conductive sectors acts as a ground sector, with the other conductive sector acting as a signal sector. The central electrically predetermined sector in this embodiment is comprised of insulative material, and hence is adapted to act as an insulator.

In another embodiment, there are three sectors comprising two conductive sectors and one electrically predetermined sector. In this embodiment the element is adapted to act as either a resistor or a capacitor, depending upon whether the central electrically predetermined sector is composed of resistive or capacitive material.

In another embodiment of the invention, the element comprises five sectors, two of which are electrically predetermined, and three of which are conductive. In this embodiment, the two exterior conductive sectors constitute ground sectors, and the central conductive sector constitutes a signal sector. The two electrically predetermined sectors are comprised of a insulative material, and are spaced between the three conductive sectors.

In another embodiment, applicable to only elements used as resistors or capacitors, the element is divided axially (as opposed to longitudinally) into three sectors. In this embodiment, the element comprises a conductive sector at each end of the element, including the tab portions, and a central electrically predetermined sector composed of either resistive or capacitive material. In this embodiment, there is no direct electrical connection between the corresponding pair of pads by means of a single conductive sector. Rather, current from one of the pair of pads to the other is forced through the electrically predetermined sector.

In another embodiment of the invention, the element is divided laterally (as opposed to longitudinally or axially) into three sectors. The three sectors are effectively sandwiched, such that all three sectors, as in the first embodiment, extend into the tab portions. Unlike the first embodiment, however, only one of the electrically conductive sectors engages the contact pads on the circuit board. The other conductive sector touches the contact pad of the other board. Hence, as in the previous embodiment, current is forced through the electrically predetermined sector.

This invention offers significant electrical signal quality advantages at the high frequencies found in high speed chips. Controlled impedance is obtained by the manner in which the two conductive sectors are separated by the electrically predetermined sector. The impedance of a circuit may easily be adjusted by altering the thickness of an insulative sector, and by altering and the size and shape of the conductive sectors of the element to be inserted into the support member. Further, the inductance of the interconnection or termination is lowered, thus providing enhanced connector performance, and better signal transmission.

Additionally, use of interconnect elements as termination resistors or decoupling capacitors is extremely valuable in high speed chips, since such elements increase processing speed and save board space. The invention offers elements which can be used in such a manner.

Because the impedance of an interconnect element may matched to the impedance of the circuit board to which it is connected, reflections and other associated undesirable effects may be eliminated at the board-connector interface.

Other features and advantages of the invention will understood from the following descriptions of the drawings and the preferred embodiments, and from the claims.

BRIEF DESCRIPTION OF THE DRAWINGS

FIGS. 4, 5, and 6 are schematic perspective diagrams illustrating longitudinal 3-sector embodiments of the invention.

FIG. 7 is a schematic perspective diagram illustrating a longitudinal 5-sector embodiment of the invention.

FIGS. 8 and 9 are schematic perspective diagrams illustrating axial 3-sector embodiments of the invention.

FIGS. 10 and 11 are schematic perspective diagrams illustrating lateral 3-sector embodiments of the invention.

DESCRIPTION OF THE PREFERRED EMBODIMENTS

Figure 1:
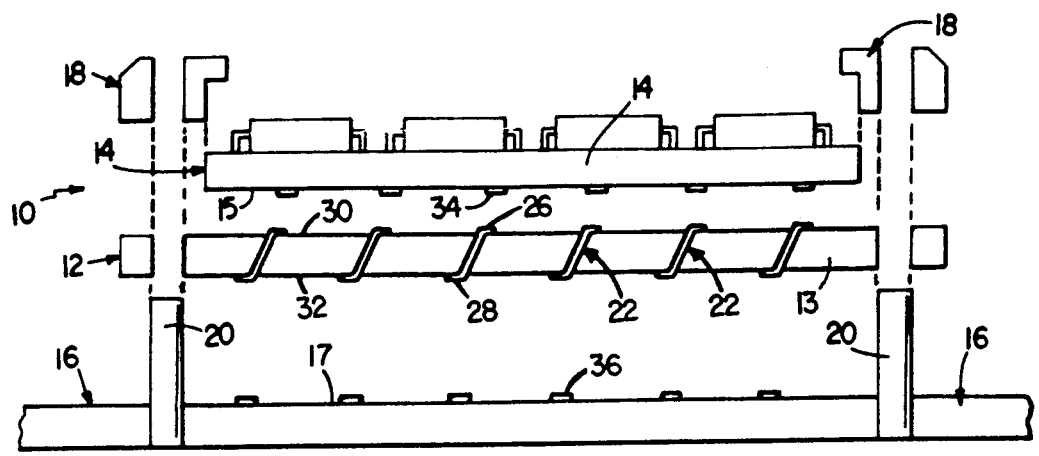
FIGS. 1, 2, and 3 are partially diagrammatic side section views of a circuit including a preferred embodiment of the connector arrangement system of the invention, respectively showing the circuit in exploded, assembled, and compression states.

Referring to FIG. 1, the electrical circuit 10 consists of connector arrangement 12 disposed between first and second electrical circuit boards 14 and 16. Clamping frame 18 is provided for fixed assembly of the circuit over alignment posts 20.

Area array connector arrangement 12 consists of a sheet-form support member 13 of planar expanse, having uncompressed thickness, e.g., between 0.025 and 0.500 inch, and preferably about 0.125 inch, including resilient, electrically nonconductive elastomeric material in the form of open cell foam having a density in the range of about 2 to 50 lbs/ft$^3$ preferably about 15 to 25 lbs/ft$^3$ for an air or cell volume in the range of about 25% to 95%, preferably about 60 to 75%.

Area array connector 12 also consists of an array of interconnect elements 22, disposed in the support member 13, and positioned selectively in the plane of the connector array, with the element 22 extending through the support member to expose the element tab portions (contact pad engagement surfaces) 26 and 28 adjacent to the connector array surfaces 30 and 32. The relative positions of the engagement surfaces are predetermined to correspond, when assembled, to the positions of contact pads of the opposed circuit board surfaces.

Disposed above and below area array connector arrangement 12 are circuit boards 14 and 16, having board surfaces 15 and 17 respectively, opposed to connector array support surfaces 30 and 32. Disposed on the board surfaces are sets of contact pads 34 and 36.

Figure 2:
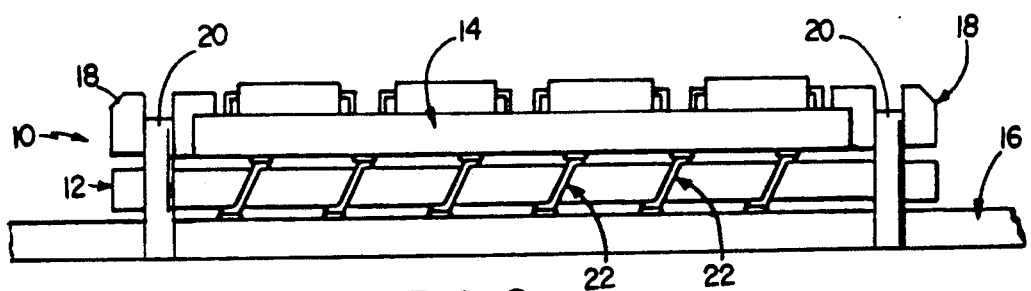
Figure 3:
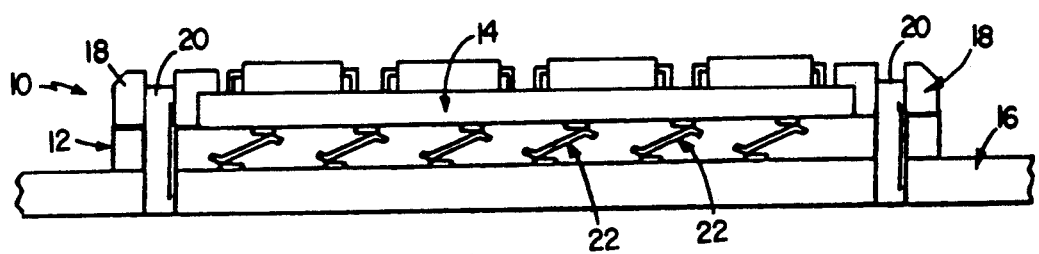

When assembled, as shown in FIG. 2, each set of contact pads 34 of board 14 lies in electricity-conductive contact with the opposed tab portion 26 of interconnect element 22, which extends through the support member 13 to electricity-conductive contact between tab portion 28 and the set of contact pads 36 of the opposed circuit board 16. The pairs of sets of contact pads connected via element 22 are offset from each other, and the element is configured in a manner to cause the element to move bodily in the support member as compressional force is applied to the opposed boards, as shown in FIG. 3.

One embodiment of the interconnect element according to the instant invention is demonstrated in FIG. 4. The interconnect element 50 is divided into a plurality of longitudinal sectors, in this case three: 52, 54, and 56. The two conductive sectors 52 and 56, composed of e.g. Cu of BeCu, are separated by the insulative electrically predetermined sector 54, composed of e.g. polyiimide epoxy or phenolic fluoropolymers. The tab portions 58 and 60 are designed to wipe against the contact pads of the two corresponding circuit boards, as shown in FIGS. 1-3, thus forming an electrical connection. In this embodiment, the conductive sectors 52 and 56 connect two separate pairs of corresponding surface pads. Thus, for example, one of the conducive sectors on the element may be used as a ground connector while the other is used as a signal connector.

FIG. 5 demonstrates another embodiment of the interconnect element according to the invention. The interconnect element 70 has two conductive sectors 72 and 76, and one electrically predetermined sector 74. The electrically predetermined sector is composed of a resistive material, e.g. nickel, nickel-carbon-chromium, or resistive inks such as a matrix of silver-coated spheres in a polymer carrier, thus making the element usable as a termination resistor.

FIG. 6 demonstrates still another embodiment of the interconnect element 80 of the invention, again divided longitudinally into three sectors 82, 84, and 86. The interconnect element 80 has two conductive sectors 82 and 86, and an electrically predetermined sector 84. The electrically predetermined sector 84 is composed of a capacitive material, e.g. ceramic of any high-capacitance dielectric, such as ceramic-filled polymers of various types and compositions, thus making the element suitable for use as a decoupling capacitor.

FIG. 7 demonstrates another embodiment of the interconnect element of the invention. The interconnect element 90 is divided into a plurality of sectors, in this case five: 91, 92, 93, 94, and 95. In this embodiment, the three conductive sectors 91, 93, and 95 are separated by the insulative electrically predetermined sectors 92 and 94. Again, the tab portions 96 and 97 are designed to wipe against the contact pads of the two corresponding circuit boards as shown in FIGS. 1-3, thus forming an electrical connection. In this embodiment, the conductive sectors 91, 93, and 95 connect three separate pairs of corresponding surface pads. In this embodiment, for example, the two exterior conductive sectors 91 and 95 function as ground connectors, the central conductive sector 93 acts as a signal connector, while the two insulative electrically predetermined sectors 92 and 94 insulate the conductive sectors from each other.

FIG. 8 demonstrates another embodiment of the interconnect element of the invention. In the embodiment, the interconnect element 100 comprises two conductive sector 102 and 106, and one electrically predetermined sector 104. Unlike the embodiments of the interconnect element described above, in which the element was divided longitudinally into the plurality of sectors, here the element 100 is divided axially. Thus, in this embodiment, the two conductive sectors 102 and 106 are situated at the opposite ends of the element, each conductive sector including one of the tab portions. In FIG. 8, conductive sector 102 includes tab portion 108, while conductive sector 106 includes tab portion 110. The central electrically predetermined sector is situated somewhere between the two conductor sectors, and is composed of resistive material, whereby the element 100 is suitable for use as a termination resistor. As such, in this embodiment, no single conductive sector provides a direct electrical connection between the pair of corresponding contact pads. Rather, current from one of the pair of pads to the other is forced through the resistor formed by the electrically predetermined sector.

FIG. 9 demonstrates another embodiment of the interconnect element 120 of the invention. This embodiment is almost identical to the immediately previous embodiment, except that the central electrically predetermined sector 124 of the interconnect element 120 is composed of a capacitive material, thus making the element 120 suitable for use as a decoupling capacitor. Like the immediately previous embodiment, here the element 120 is divided axially. Thus, in this embodiment, the two conductive sectors 122 and 126 are situated at the opposite ends of the element, each conductive sector including one of the tab portions. In FIG. 9, conductive sector 122 includes tab portion 128, while conductive sector 126 includes tab portion 130. The central electrically predetermined sector, as above, is situated somewhere between the two conductor sectors. As such, no single conductive sector provides a direct electrical connection between the pair of corresponding contact pads. Rather, current from one of the pair of pads to the other is forced through the capacitor formed by the electrically predetermined sector.

Another embodiment of the interconnect element is illustrated by FIG. 10. As before, the interconnect element 140 comprises two conductive sectors 142 and 146, and one electrically predetermined sector 144. Unlike the above-discussed embodiments, in which the element was divided either longitudinally or axially into the plurality of sectors, here the element 140 is divided laterally. Thus, in this embodiment of the interconnect element, like the first-described embodiment of the element, the three sectors 142, 144 and 146 are effectively sandwiched, such that all three extend into the tab portions 148 and 150. Unlike the first embodiment, however, only one of the electrically conductive sectors engages a contact pad of a circuit board at each tab portion. To illustrate from FIG. 10, the conductive sectors 142 and 146 extend throughout the length of the element 140. However, only conductive sector 142 is positioned to engage a contact pad of a first circuit board from tab portion 150. Likewise, only conductive sector 146 is positioned to engage a contact pad of a second circuit board from tab portion 148. The central electrically predetermined sector 144 is sandwiched between the two conductor sectors 142 and 146, and is composed of resistive material, thus making the interconnect element 140 suitable for use as a termination resistor. As such, no single conductive sector provides a direct electrical connection between the pair of corresponding contact pads. Rather, current from one of the pair of pads to the other is forced through the resistor formed by the electrically predetermined sector 144.

Another embodiment of the interconnect element is illustrated by FIG. 11. As before, the interconnect element 160 comprises two conductive sectors 162 and 166, and one electrically predetermined sector 164. Like the immediately-previous embodiment, here the element 160 is divided laterally. Thus, in this embodiment of the interconnect element, the three sectors 162, 164 and 166 are effectively sandwiched, such that all three extend into the tab portions 168 and 170. Like the immediately-previous embodiment, however, only one of the electrically conducive sectors engages a contact pad of a circuit board at each tab portion. To illustrate from FIG. 11, the conductive sectors 162 and 166 extend throughout the length of the element 160. However, only conducive sector 162 is positioned to engage a contact pad of a first circuit board from tab portion 170. Likewise, only conductive sector 166 is positioned to engage a contact pad of a second circuit board from tab portion 168. The central electrically predetermined sector 164 is sandwiched between the two conductor sectors 162 and 166, and is composed of capacitive material, thus making the interconnect element 160 suitable for use as a decoupling capacitor. As such, no single conductive sector provides a direct electrical connection between the pair of corresponding contact pads. Rather, current from one of the pair of pads to the other is forced through the resistor formed by the electrically predetermined sector 164.

Figure 12:
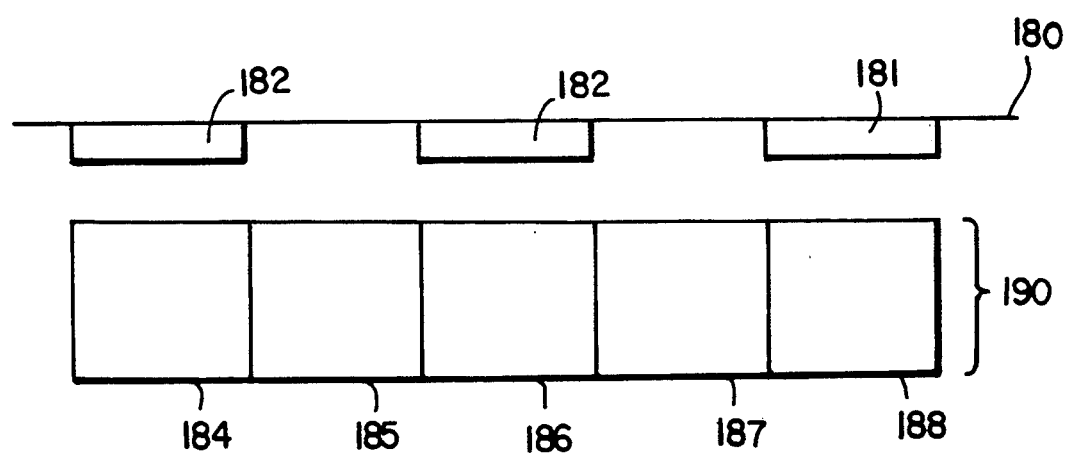
FIG. 12 is a schematic cross-section diagram of a tab portion of the interconnect element, as shown in FIG. 7, showing its interaction with contact pads of a circuit board.

FIG. 12 illustrates the interaction between contact pads of a circuit board and a tab portion of an interconnect element. The configuration shown is for an interconnect element according to the embodiment of the invention shown in FIG. 7. The contact pads 181-183 on a circuit board surface 180 are shown just prior to contact and connection with a tab portion 190 of an interconnect element. The tab portion 190 is divided into two electrically predetermined sectors 185 and 187 and three conductive sectors 184, 186, and 188. In FIG. 12, pads 181 and 183, which connect to sectors 188 and 184 respectively, function as ground connections. Likewise, pad 182, which contacts and connects to sector 186, serves as the signal connection.

Figure 13:
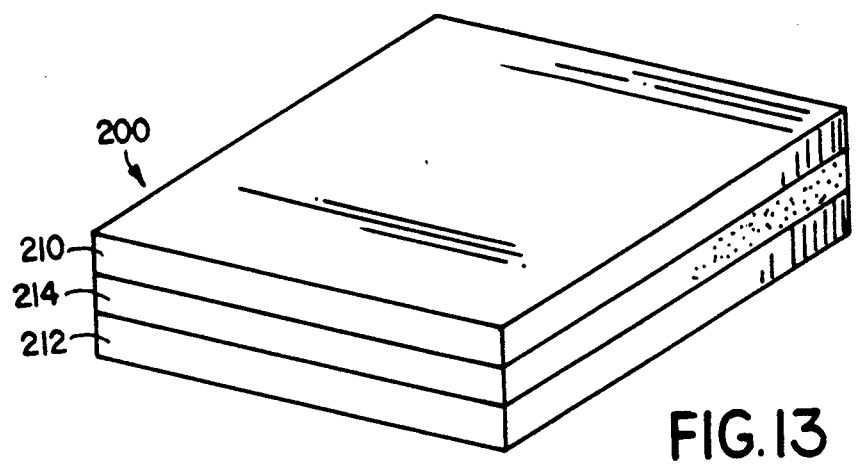
FIG. 13 is a perspective view of a sheet of laminate for use in manufacturing interconnection elements having microstrip characteristics.
Figure 14:
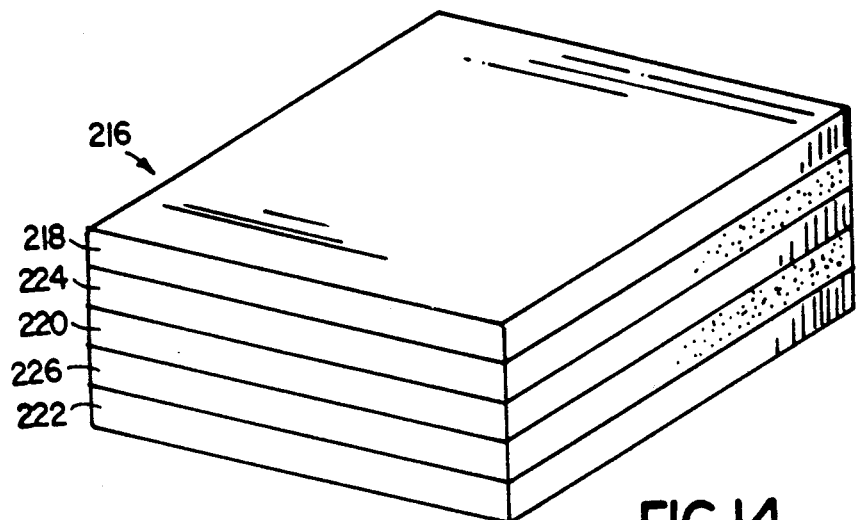
FIG. 14 is a perspective view of a sheet of laminate for use in manufacturing interconnection elements having stripline characteristics.
Figure 15:
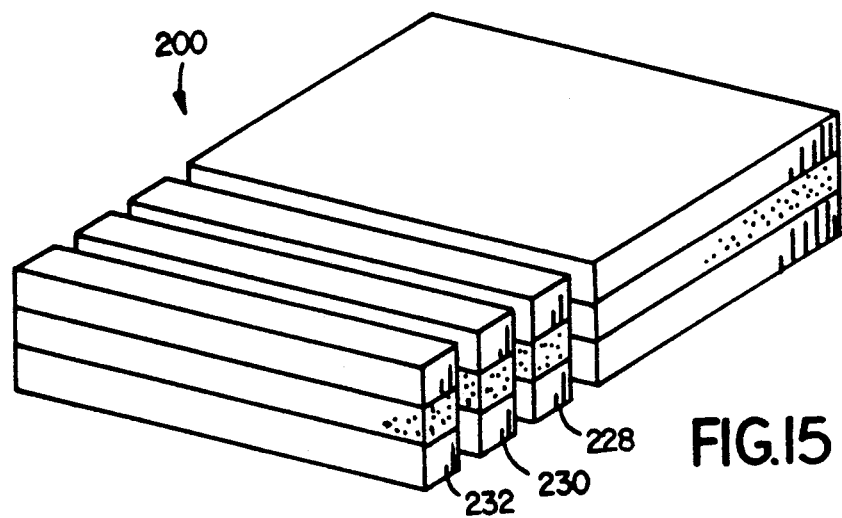
FIG. 15 is a perspective view of the sheet of laminate of FIG. 13 after it has been cut into strips.
Figure 16:
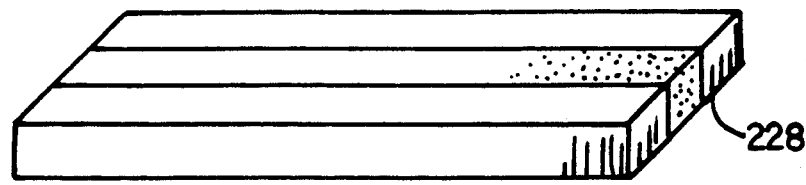
FIG. 16 is a perspective view of one of the strips of FIG. 15.
Figure 17:
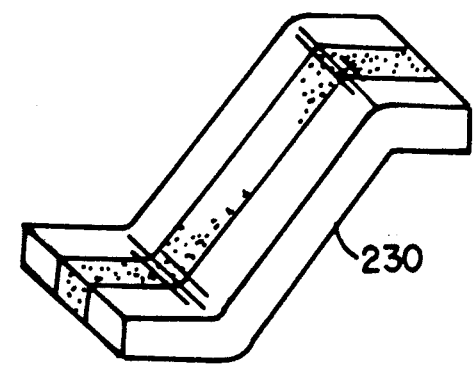
FIG. 17 is a perspective view of an interconnect element as manufactured by bending the strip of FIG. 16.

Referring to FIGS. 13-14, a method of manufacturing interconnection elements includes preparing a sheet 200 of a laminate comprising two conductive (e.g., copper) layers 210, 212, and a layer 214 having predetermined electrical characteristics (e.g., a dielectric such as PTFE). Alternatively, a sheet 216 may include three conductive layers 218, 220, 222 and two dielectric layers 224, 226. The sheet 200 may then be cut in to slices 228, 230, 232, and each slice 228 is bent into its final S-shaped configuration 230 (see FIGS. 16 and 17).

Figure 18:
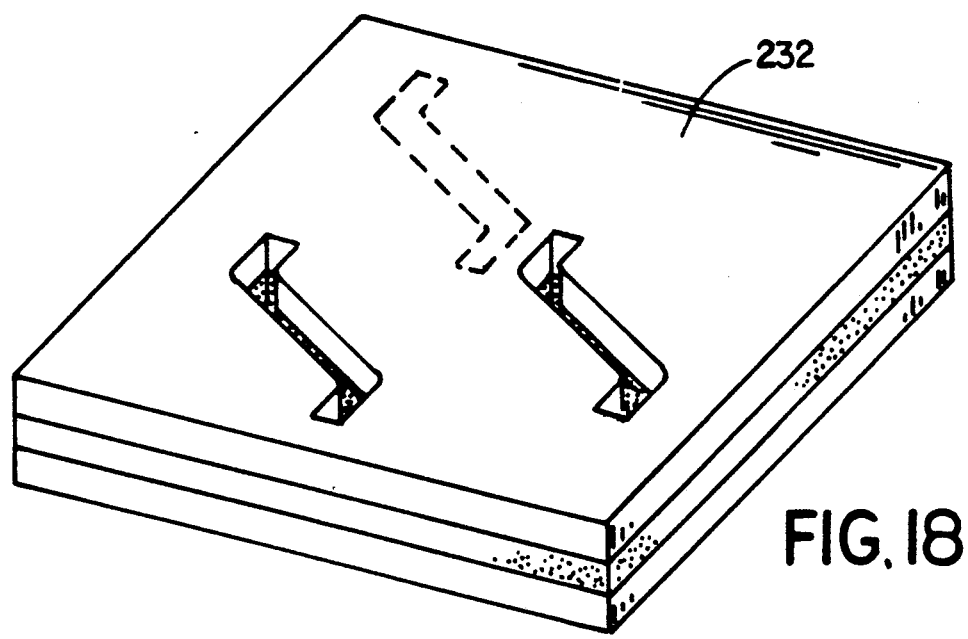
FIG. 18 is a perspective view of a sheet of laminate for use in manufacturing interconnection elements having microstrip characteristics, showing portions from which interconnection elements have been stamped.
Figure 19:
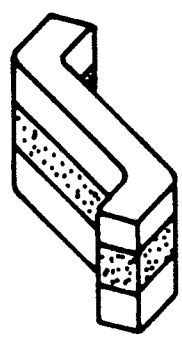
FIG. 19 is a perspective view of an interconnection element stamped from the sheet of FIG. 18.

In an alternative method, the S-shaped interconnection elements are stamped out of similar sheets of laminate 232 using an S-shaped die (see FIGS. 18 and 19).

Other embodiments are within the following claims.

What is claimed is:

1. An electrical interconnect assembly comprising a plurality of discrete elongated, unitary, bodily-rotatable interconnect elements each having end portions at opposite ends of the element defining a pair of pad engagement surfaces disposed to engage corresponding contact pads on opposing surfaces of two circuit substrates, and a support member of non conductive resilient material holding said interconnect elements in place, said end portions of said elements adapted to be disposed close to resilient support surfaces of the support member to engage upon the support surfaces during bodily rotation of said interconnect elements with local compression of the resilient support member, wherein each of said interconnect elements comprises
   a laminate comprised of a series of parallel, side-by-side layers extending longitudinally through said element, arranged such that each layer extends across the thickness of the element to define a longitudinally extending sector, said sectors including two electrically conductive sectors, the end portions of each of said conductive sectors being disposed to engage respective conductive pad portions on both said substrates, each conductive sector defining an electrical path between said pad portions, and
   a less conductive sector separating said conductive sectors, said additional sector having a predetermined electrical characteristic selected to cooperate with said conductive sectors to provide to the unitary bodily-rotatable interconnect element a predetermined desired impedance other than a simply conductive impedance.

2. The interconnect assembly of claim 1, wherein the material that comprises an electrically predetermined sector of a said interconnect element is insulative.

3. The interconnect assembly of claim 1, wherein the material that comprises an electrically predetermined sector of a said interconnect element is electrically resistive.

4. The interconnect assembly of claim 1, wherein the material that comprises an electrically predetermined sector of a said interconnect element is electrically capacitive.

5. The interconnect assembly of claim 1, wherein there are five sectors comprising
   two said electrically predetermined sectors comprised of an insulative material, and
   three said conductive sectors, comprising two exterior sectors and a central sector separated by respective predetermined sectors.

6. An electrical interconnect assembly comprising a plurality of discrete elongated, unitary, bodily-rotatable interconnect elements having end portions defining a pair of pad engagement surfaces disposed to engage corresponding contact pads on opposing surfaces of two circuit substrates, and a support member of non conductive resilient material holding said interconnect elements in place, said end portions of said elements adapted to be disposed closely in opposition to resilient support surfaces of the support member to engage upon the support surfaces during bodily rotation of said interconnect elements with local compression of the resilient support member, wherein said interconnect elements each comprises
   at least two electrically conductive sectors, and
   at least one additional, predetermined, less conductive sector separating said conductive sectors, said additional sector having a predetermined electrical characteristic selected to cooperate with said conductive sectors to provide to the unitary bodily-rotatable interconnect element a predetermined desired impedance other than a simply conductive impedance,
   wherein a said element is divided longitudinally into said sectors, end portions of each of said conductive sectors being disposed to engage respective conductive pad portions on said substrates,
   wherein there are five sectors comprising two said electrically predetermined sectors comprised of an insulative material, and three said conductive sectors, comprising two exterior sectors and a central sector separated by respective predetermined sectors, and
   wherein said two exterior conductive sectors constitute ground sectors, while said central conductive sector constitutes a signal sector.

7. The interconnect assembly of claim 1, wherein there are only three sectors comprising one central said electrically predetermined sector, and two exterior said conductive sectors.

8. An electrical interconnect assembly comprising a plurality of discrete elongated, unitary, bodily-rotatable interconnect elements having end portions defining a pair of pad engagement surfaces disposed to engage corresponding contact pads on opposing surfaces of two circuit substrates, and a support member of non conductive resilient material holding said interconnect elements in place, said end portions of said elements adapted to be disposed closely in opposition to resilient support surfaces of the support member to engage upon the support surfaces during bodily rotation of said interconnect elements with local compression of the resilient support member, wherein said interconnect elements each comprises at least two electrically conductive sectors, and at least one additional, predetermined, less conductive sector separating said conductive sectors, said additional sector having a predetermined electrical characteristic selected to cooperate with said conductive sectors to provide to the unitary bodily-rotatable interconnect element a predetermined desired impedance other than a simply conductive impedance, wherein a said element is divided longitudinally into said sectors, end portions of each of said conductive sectors being disposed to engage respective conductive pad portions on said substrates, wherein there are only three sectors comprising one central said electrically predetermined sector, and two exterior said conductive sectors, and wherein one of said two exterior conductive sectors constitutes a ground sector, with the other said exterior conductive sector constituting a signal sector.

9. An electrical interconnect assembly comprising a plurality of discrete elongated, unitary, bodily-rotatable interconnect elements divided axially and each having end portions at opposite ends of the element defining a pair of pad engagement surfaces disposed to engage corresponding contact pads on opposing surfaces of two circuit substrates, wherein each of said interconnect elements comprises at least two electrically conductive sectors, each of only two of said conductive sectors being electrically connected to a corresponding one of said pad engagement surfaces, and at least one additional, predetermined, less conductive sector axially separating said conductive sectors to provide a succession of sectors along the length of said element, such that each electrical path extending between pad engagement surfaces on said substrates is defined by said succession of sectors in series, said additional sector having a predetermined electrical characteristic selected to cooperate with said conductive sectors to provide to the unitary bodily-rotatable interconnect element a predetermined desired series-connected impedance other than a simply conductive impedance, and a support member of non conductive resilient material holding said interconnect elements in place, said end portions of said elements adapted to be disposed close to resilient support surfaces of the support member to engage upon the support surfaces during bodily rotation of said interconnect elements with local compression of the resilient support member.

10. An electrical interconnect assembly comprising a plurality of discrete elongated, unitary, bodily-rotatable interconnect elements each having end portions at opposite ends of the element defining a pair of pad engagement surfaces disposed to engage corresponding contact pads on opposing surfaces of two circuit substrates, and a support member of non conductive resilient material holding said interconnect elements in place, said end portions of said elements adapted to be disposed close to resilient support surfaces of the support member to engage upon the support surfaces during bodily rotation of said interconnect elements with local compression of the resilient support member, wherein each of said interconnect elements comprises a laminate comprised of a stack of parallel layers extending through said element, arranged such that each layer extends across the width of the element to define a laterally extending sector, said sectors including at least two electrically conductive sectors including different exterior sectors exposed at opposite ends of said element for contact with pads on respective substrates, and at least one additional, predetermined, less conductive sector separating said conductive sectors such that each electrical path extending between pad engagement surfaces on said substrates is defined by said succession of sectors in said series, said additional sector having a predetermined electrical characteristic selected to cooperate with said conductive sectors to provide to the unitary bodily-rotatable interconnect element a predetermined desired series-connected impedance other than a simply conductive impedance.

11. The interconnect assembly of claim 1, 6, 8, 9 or 10 wherein a said interconnect element is generally of S-shape.

12. The interconnect assembly of claim 1, 6, 8, 9 or 10 wherein said conductive and predetermined sectors are configured to provide decoupling capacitance to said interconnect element.

13. The interconnect assembly of claim 1, 6, 8, 9 or 10, wherein said conductive sectors are configured to provide termination resistance to said interconnect element.

14. The interconnect assembly of claim 1, 6, 8, 9 or 10, wherein multiple interconnect elements are supported by said support member in pad-engaging relationship with respective contact pads on said substrates, including elements having sectors of differing electrical characteristics selected to correspond to the electrical needs of the circuits with which said pads are associated.

15. A method of producing an elongated, bodily-rotatable interconnect element having end portions defining a pair of pad engagement surfaces disposed to engage corresponding contact pads on opposing surfaces of two circuit substrates, said interconnect element adapted to be held in place between said opposing substrates by a support member of resilient material, said end portions adapted to be disposed closely in opposition to resilient support surfaces of the support member to engage upon the support surfaces during bodily rotation of said interconnect element with local compression of the resilient support member, said method comprising preparing a laminated sheet comprising at least two electrically conductive layers, and at least one additional, less conductive layer separating said conductive sectors, said additional sector having a predetermined electrical characteristic selected to cooperate with said conductive sectors to provide to the resulting interconnect element a predetermined desired impedance other than a simply conductive impedance, and forming said element from a portion of said sheet.

16. The method of claim 15, wherein said step of forming said element includes cutting a portion of said sheet and bending said portion to form said interconnect element.

17. The method of claim 15, wherein said step of forming said element includes cutting said sheet with a die having the same outline as the resulting interconnect element.

18. The method of claim 17, wherein said die is S-shaped.

19. An interconnect element, said element being produced in accordance with the process of claim 15, 16, 17 or 18.

20. A circuit board electrical connector arrangement system for providing electrical interconnection between a first plurality of sets of contact pads arranged on a surface of a first circuit board and a second plurality or corresponding sets of contact pads on an opposed surface of a second circuit board, said connector arrangement system comprising an electrically nonconductive support member adapted to be disposed between the circuit boards and comprising resilient elastomeric foam material defining a distribution of voids, said support member having support surfaces to be respectively opposed to the surfaces of the circuit boards and being adapted to be compressed by urging of the circuit boards together, and a plurality of bodily-rotatable interconnect elements, each divided longitudinally into five sectors comprising two electrically predetermined sectors that comprise an insulative material and three conductive sectors that include two exterior grand sectors and a central signal sector, said conductive sectors and said electrically predetermined sectors being arranged in an alternating pattern within said interconnect element, the body of said interconnect element extending generally in the direction of the thickness of the resilient elastomeric foam support member and tab portions projecting angularly from the respective ends of said body, said tab portions defining a pair of pad engagement surfaces disposed to engage the respective corresponding contact pads, a line projected through said engagement surfaces being disposed at an initial, acute angle to the direction of thickness of said support member, and said tab portions defining engagement surfaces disposed at least closely in opposition to said support surfaces of said support member to engage upon said support surfaces during bodily rotation of said interconnect element of locally compress the elastomeric foam of said support member, whereby, when said connector arrangement system is disposed between the circuit boards in a clamped-together relationship with said interconnect elements in registry with their respective corresponding sets of contact pads and with said interconnect elements rotated bodily as a result of said clamping so that said line projected through said pad engagement surfaces of each element lies at an acute angle resiliently supported by said elastomeric foam to bear with force upon the contact pads, said voids of said elastomeric foam of said support member serve locally to accommodate bodily rotation of said interconnect elements in a manner avoiding disturbance of adjacent elements whereby displacement of the elastomeric foam material of said support member about each said interconnect element is limited generally to the local region of said element.

21. An elongated, bodily-rotatable interconnect element, with tab portions projecting angularly from the respective ends of said interconnect element, said tab portions defining a pair of pad engagement surfaces disposed to engage corresponding contact pads on opposing surfaces of two circuit boards, said interconnect element adapted to be held in place between said opposing circuit boards by a support member of elastic material, and said engagement surfaces of said interconnect element adapted to be disposed closely in opposition to support surfaces of the support member to engage upon the support surfaces during bodily rotation of said interconnect element to locally compress the support member, said interconnect element divided into a plurality of sectors, said interconnect element comprising two electrically predetermined sectors comprised of an insulative material, and three conductive sectors, comprising two exterior ground sectors and a central signal sector, said conductive sectors and said electrically predetermined sectors being arranged in an alternating pattern.

* * * * *

UNITED STATES PATENT AND TRADEMARK OFFICE
CERTIFICATE OF CORRECTION

PATENT NO.   : 5,096,426

DATED        : March 17, 1992

INVENTOR(S)  : Scott S. Simpson et al.

It is certified that error appears in the above-identified patent and that said Letters Patent is hereby corrected as shown below:

ON THE TITLE PAGE:

In the abstract, line 13, "patter" should be --pattern--;

Col. 6, line 66, "conducive" should be --conductive--;

Col. 9, claim 8, line 8, delete "and";

Col. 11, claim 20, line 15, "or" should be --of--.

Signed and Sealed this

Twenty-eighth Day of September, 1993

Attest:

BRUCE LEHMAN

Attesting Officer    Commissioner of Patents and Trademarks